(12) United States Patent
Yoshino

(10) Patent No.: US 11,424,159 B2
(45) Date of Patent: Aug. 23, 2022

(54) SEMICONDUCTOR DEVICE AND METHOD OF MANUFACTURING THE SEMICONDUCTOR DEVICE

(71) Applicant: ABLIC Inc., Tokyo (JP)

(72) Inventor: Hideo Yoshino, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 17/015,301

(22) Filed: Sep. 9, 2020

(65) Prior Publication Data

US 2021/0098291 A1    Apr. 1, 2021

(30) Foreign Application Priority Data

Sep. 30, 2019  (JP) .............................. JP2019-180406

(51) Int. Cl.
*H01L 21/768*  (2006.01)
*H01L 27/06*   (2006.01)

(52) U.S. Cl.
CPC .. *H01L 21/76834* (2013.01); *H01L 21/76816* (2013.01); *H01L 27/0629* (2013.01)

(58) Field of Classification Search
CPC ......... H01L 21/76816; H01L 21/76805; H01L 21/76895; H01L 21/0629; H01L 23/481; H01L 23/5228; H01L 23/5256; H01L 23/62; H01L 23/647
See application file for complete search history.

(56) References Cited

U.S. PATENT DOCUMENTS

| | | | | |
|---|---|---|---|---|
| 2004/0124477 A1* | 7/2004 | Minami | .............. | H01L 21/8238 257/379 |
| 2014/0210042 A1* | 7/2014 | Hasegawa | ........... | H01L 23/5258 257/529 |
| 2018/0182706 A1* | 6/2018 | Nomura | .................. | H01L 21/82 |

FOREIGN PATENT DOCUMENTS

JP      2004-165236 A      6/2004

* cited by examiner

*Primary Examiner* — Brigitte A Paterson
*Assistant Examiner* — Lawrence C Tynes, Jr.
(74) *Attorney, Agent, or Firm* — Crowell & Moring LLP

(57) ABSTRACT

A semiconductor device, including: a first semiconductor element formed at a first surface on a substrate, and has a first electrode portion formed thereon a first metal silicide film; a second semiconductor element formed at a second surface at a higher position than the first surface, and has a second electrode portion formed thereon a second metal silicide film and a hydrogen supply film configured to cover a part of an upper portion of the second metal silicide film; an interlayer insulating film formed on the first semiconductor element and the second semiconductor element; a first contact hole formed through the interlayer insulating film until the first metal silicide film; a second contact hole formed through the interlayer insulating film and the hydrogen supply film until the second metal silicide film; and a metal wiring embedded in each of the first contact hole and the second contact hole.

5 Claims, 5 Drawing Sheets

SEMICONDUCTOR DEVICE AND METHOD OF MANUFACTURING THE SEMICONDUCTOR DEVICE

RELATED APPLICATIONS

This application claims priority to Japanese Patent Application No. 2019-180406, filed on Sep. 30, 2019, the entire content of which is incorporated herein by reference.

BACKGROUND OF THE INVENTION

1. Field of the Invention

The present invention relates to a semiconductor device and a method of manufacturing the semiconductor device.

2. Description of the Related Art

In some semiconductor devices in which fine elements are formed on a semiconductor substrate made of silicon or other such materials, a resistor, a fuse, or other such semiconductor elements are formed as well as a metal-insulator-semiconductor field-effect transistor (MISFET), a metal-oxide-semiconductor field-effect transistor (MOSFET), or other such semiconductor elements.

For example, the following semiconductor device is considered in which an upper surface of the semiconductor substrate is partially oxidized to form a thick oxide film, which is a LOCOS (local oxidation of silicon) film, for the purpose of electrical isolation among the elements in order to form a MOSFET and a resistive element on the same semiconductor substrate. In this semiconductor device, the MOSFET is formed on the surface of the semiconductor substrate in a thin-oxide portion (active region) and the resistive element is formed in a thick-oxide portion (field region). In the formation of contact holes from the upper surface of an insulating layer formed to cover upper surfaces of the elements, a contact hole for the resistive element has a small depth, whereas a contact hole for the MOSFET has a large depth since the distance of each element measured from the planarized surface of the insulating layer differs by the location the element is formed on. In forming the contact holes having different depths at a time through the same etching process, the resistive element for which the shallow contact hole is formed is over-etched and perforated. This leads to reduction in contact area with a metal member filling the contact hole, and thus leads to degradation in quality due to improper conduction in some cases.

To deal with the above-mentioned case, there is known a technology using a silicon nitride film as an etching-stopper by an insulating film (for example, see Japanese Patent Application Laid-open No. 2004-165236).

SUMMARY OF THE INVENTION

The present invention has an object to provide a semiconductor device capable of reducing a resistance of a conduction path formed a contact hole, and also of suppressing occurrence of defect caused by hydrogen over time.

According to an embodiment of the present invention, there is provided a semiconductor device, including: a first semiconductor element formed on a first surface of a substrate, and having a first electrode portion on which a first metal silicide film is formed; a second semiconductor element formed on a second surface which locates at a higher position than the first surface, and having a second electrode portion on which a second metal silicide film and a hydrogen supply film covering a part of an upper portion of the second metal silicide film; an interlayer insulating film formed on the first semiconductor element and the second semiconductor element; a first contact hole formed through the interlayer insulating film on the first electrode portion, reaching the first metal silicide film; a second contact hole formed through both the interlayer insulating film and the hydrogen supply film on the second electrode portion, and reaching the second metal silicide film; and a metal wiring embedded in each of the first contact hole and the second contact hole.

According to the present invention, the semiconductor device capable of reducing the resistance of the conduction path formed the contact hole, and also of suppressing occurrence of defect caused by hydrogen over time can be provided.

DETAILED DESCRIPTION OF THE PREFERRED EMBODIMENTS

Figure 1:
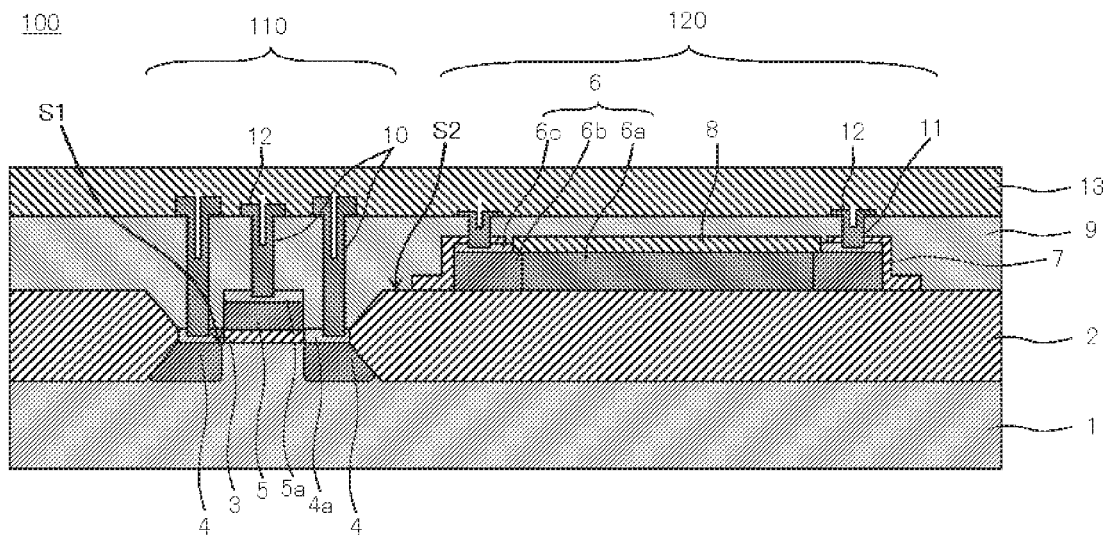
FIG. 1 is a schematic sectional view of a semiconductor device according to a first embodiment of the present invention.

According to an embodiment of the present invention, there is provided a semiconductor device, including: a first semiconductor element formed on a first surface of a substrate, and having a first electrode portion on which a first metal silicide film is formed; a second semiconductor element formed on a second surface which locates at a higher position than the first surface, and having a second electrode portion on which a second metal silicide film and a hydrogen supply film covering a part of an upper portion of the second metal silicide film; an interlayer insulating film formed on the first semiconductor element and the second semiconductor element; a first contact hole formed through the interlayer insulating film on the first electrode portion, reaching the first metal silicide film; a second contact hole formed through both the interlayer insulating film and the hydrogen supply film on the second electrode portion, reaching the second metal silicide film; and a metal wiring embedded in each of the first contact hole and the second contact hole.

The semiconductor device according to the embodiment of the present invention is achieved based on the following findings.

In a semiconductor device, in general, there is a case in which the first surface on which the first semiconductor element is formed, and the second surface on which the second semiconductor element is formed, are at different heights, and the second contact hole formed on the second semiconductor element has a smaller depth than the first contact hole formed on the first semiconductor element. In this case, in the semiconductor device according to the embodiment of the present invention, when contact holes having different depths are formed at a time through the same etching process as in the technology described in, for example, Japanese Patent Application Laid-open No. 2004-165236, the second contact hole can be formed without over-etching to perforate the second semiconductor element since the hydrogen supply film present on the second electrode portion functions as an etching stopper.

However, in the technology described in Japanese Patent Application Laid-open No. 2004-165236, in direct contact of a metal wiring with a silicon electrode portion of the semiconductor element at a junction portion between the metal wiring and the electrode portion at the contact hole, the resistance sometimes increases. Further, in Japanese Patent Application Laid-open No. 2004-165236, there is a description about forming a silicon nitride film (hydrogen supply film) as an etching stopper through low-pressure CVD. However, because the low-pressure CVD requires as high temperature as about 700° C., the silicon nitride film cannot be formed on a metal film or an alloy film in some cases. Still further, the silicon nitride film formed by the low-pressure CVD has high crystallinity and has low permeability from the outside so that hydrogenation treatment is needed, increasing the number of process flows.

In view of the forgoing, in order to reduce the resistance at the junction portion between the metal wiring and the electrode portion, the semiconductor device according to the embodiment of the present invention has a low-resistance metal silicide film formed on the electrode portion. Further, in the case of forming the bottom surface of the contact hole to locate in the metal silicide film, a lower surface (bottom surface) of the metal wiring embedded in the contact hole reaches the low-resistance metal silicide film within the low-resistance metal silicide film, further reducing the resistance at the junction portion between the metal wiring and the electrode portion.

Further, the hydrogen supply film in the semiconductor device according to the embodiment of the present invention does not cover the entire second semiconductor element but covers only a part of the upper portion of the second metal silicide film, as an etching stopper. Hence, the volume and area of the hydrogen supply film are small. With this structure, the semiconductor device according to the embodiment of the present invention can reduce an amount of hydrogen released with time from the hydrogen supply film and suppress occurrence of defect caused by hydrogen. In addition, the volume and area of the hydrogen supply film are small, and hence occurrence of defect caused by a residual stress thereof can be suppressed as well.

As described above, the semiconductor device according to the embodiment of the present invention can reduce the resistance of the conduction path formed the contact hole, and also suppress occurrence of defect caused by hydrogen with time.

As an example of the semiconductor device according to the embodiment of the present invention, it is preferred that the semiconductor device further includes a metal film formed in the vicinity of an upper portion of the second semiconductor element.

In this preferred example, through the formation of the metal film that is less permeable to hydrogen or moisture in the vicinity of the upper portion of the second semiconductor element, for example, it is possible to suppress occurrence of defect caused by hydrogen or moisture.

As another example of the semiconductor device according to the embodiment of the present invention, it is preferred that the second semiconductor element is a resistive element formed from a polycrystalline silicon film having a low-concentration impurity region and high-concentration impurity regions, and the hydrogen supply film be formed at a position apart from the low-concentration impurity region.

In this another preferred example, through the formation of the hydrogen supply film at the position apart from the low-concentration impurity region serving as a resistor of the resistive element, the resistor is less affected by hydrogen released from the hydrogen supply film. As a result, it is possible to reduce a change with time of the resistance.

As still another example of the semiconductor device according to the embodiment of the present invention, it is preferred that the semiconductor device further includes a hydrogen barrier film formed on the low-concentration impurity region.

In this still another preferred example, through the formation of the hydrogen barrier film capable of blocking hydrogen on the low-concentration impurity region serving as the resistor of the resistive element, the resistor can be less affected by hydrogen, permitting reduction of a change with time of the resistance.

A method of manufacturing a semiconductor device according to an embodiment of the present invention includes: forming a first semiconductor element at a first surface of a substrate, the first semiconductor element having a first electrode portion on which a first metal silicide film is formed; forming a second semiconductor element at a second surface at a higher position than the first surface, the second semiconductor element having a second electrode portion on which a second metal silicide film and a hydrogen supply film which covers a part of an upper portion of the second metal silicide film are formed; forming an interlayer insulating film on the first semiconductor element and the second semiconductor element; forming a first contact hole through the interlayer insulating film on the first electrode portion to reach the first metal silicide film; forming a second contact hole through both the interlayer insulating film and the hydrogen supply film on the second electrode portion to reach the second metal silicide film; and embedding a metal wiring into each of the first contact hole and the second contact hole.

The method of manufacturing a semiconductor device according to the embodiment of the present invention manufactures the above-mentioned semiconductor device which is capable of reducing the resistance of the conduction path formed the contact hole, and also of suppressing occurrence of defect caused by hydrogen with time.

Next, embodiments of the semiconductor device according to the present invention are described specifically with reference to the drawings.

In the following description, for example, the numbers, positions, shapes, structures, and dimensions of a plurality of films and semiconductor elements obtained by combining those films in their structures, are not limited to those described in the following embodiments, and can be set to numbers, positions, shapes, structures, and dimensions that are preferred for carrying out the present invention.

It should be also noted that the drawings are schematic illustrations, and each film is not necessarily drawn to scale in terms of a relationship between a film thickness and a planar dimension, and a thickness ratio of the films, for example.

First Embodiment (Semiconductor Device)

FIG. 1 is a schematic sectional view of a semiconductor device according to the first embodiment of the present invention.

As illustrated in FIG. 1, a semiconductor device 100 of the first embodiment includes a substrate 1, an isolation oxide film 2, a gate oxide film 3, source/drain regions 4, a gate electrode 5, a polycrystalline silicon film 6, a silicon nitride film 7, a silicide block film 8, a silicon oxide film doped with phosphorous and boron (hereinafter referred to as "BPSG film") 9, first contact holes 10, second contact holes 11, metal wirings 12, and a passivation film 13. By structurally combining those films, a MOSFET 110 being an insulated-gate field effect transistor, and a resistive element 120 are formed on the semiconductor device 100.

The substrate 1 is a P-type silicon semiconductor substrate in the form of a wafer.

In the first embodiment, the substrate 1 is assumed to be the P-type silicon semiconductor substrate in the form of a wafer, but the present invention is not limited thereto. The shape, structure, dimension, and material of the substrate 1 can be appropriately selected depending on the purpose.

Here, a surface of the substrate 1 on a side on which other films or layers are laminated through a semiconductor manufacturing process is referred to as "upper surface", and a surface opposite to the upper surface is referred to as "lower surface".

The isolation oxide film 2 is a LOCOS (local oxidation of silicon) film formed on the substrate 1. On the isolation oxide film 2, the resistive element 120 is formed.

In the explanation, a surface (active region) on which the MOSFET 110 is formed is referred to as "first surface S1". Further, a surface (field region) at which the resistive element 120 is formed, that is, a surface of a thick portion of the isolation oxide film 2 is referred to as "second surface S2".

The thicknesses of the isolation oxide film 2 before and after its change are not particularly limited and can be appropriately selected depending on the purpose.

The MOSFET 110 as the first semiconductor element is formed on the first surface S1, and includes a gate oxide film 3, source/drain regions 4, and a gate electrode 5 in which the source/drain regions 4 and the gate electrode 5 correspond to the first electrode portion.

The gate oxide film 3 is made of a silicon oxide film.

The shape, structure, dimension, and material of the gate oxide film 3 can be appropriately selected depending on the purpose, but the structure including a silicide block is preferred.

The source/drain regions 4 are formed by implanting impurities. Further, on each of the source/drain regions 4, an alloy film 4a made of a cobalt or titanium alloy, for example, is formed as the first metal silicide film.

The shape, structure, and dimension, and the impurity type and concentration of the source/drain regions 4 can be appropriately selected depending on the purpose.

In the first embodiment, the first and second metal silicide films are each assumed to be the alloy film made of a cobalt or titanium alloy, for example. However, the present invention is not limited thereto, and materials for the first and second metal silicide films can be appropriately selected depending on the purpose. For example, alloys of molybdenum, cobalt, titanium, and nickel can be adopted. Examples of the alloy include WSi, CoSi, TiSi, and NiSi.

The gate electrode 5 is formed from a polycrystalline silicon film, and impurities are implanted thereto. Further, on the gate electrode 5, an alloy film 5a made of a cobalt or titanium alloy, for example, is formed as the first metal silicide film.

The shape, structure, dimension, and material and the impurity type and concentration of the gate electrode 5 can be appropriately selected depending on the purpose.

On an upper surface of the MOSFET 110, the BPSG film 9 as the interlayer insulating film is formed. The first contact holes 10 are formed through the BPSG film 9 to reach the alloy films 4a and 5a respectively. The metal wiring 12 (tungsten) is embedded in each first contact hole 10, to thereby form conduction paths for the source/drain regions 4 and the gate electrode 5.

In the first embodiment, the interlayer insulating film is assumed to be the BPSG film 9, but the present invention is not limited thereto.

In the source/drain regions 4 and the gate electrode 5, the first contact holes 10 whose lower surfaces locate in the alloy film 4a and the alloy film 5a are formed. Since the lower surfaces of the metal wirings 12 embedded in the first contact holes 10 reach within the low-resistance alloy films 4a and 5a, it is possible to reduce the resistance at the junction portion between the metal wirings 12 and the first electrode portion of the MOSFET 110.

The resistive element 120 as the second semiconductor element is formed on the second surface S2 at a higher position than the first surface S1. The resistive element 120 is made of the polycrystalline silicon film 6. The polycrystalline silicon film 6 has a low-concentration impurity region 6a and high-concentration impurity regions 6b formed as the second electrode portion at both ends of the low-concentration impurity region 6a.

In the first embodiment, the resistive element 120 is made of the polycrystalline silicon film 6, but the present invention is not limited thereto. For example, CrSiO, CrSiN, or TiN may be adopted.

The low-concentration impurity region 6a as a resistor is adjusted to have a desired resistance by adjusting the impurity concentration and the dimension.

On an upper surface of each high-concentration impurity regions 6b which are the electrode portions, an alloy film 6c is formed. The alloy film 6c has a lower resistance than the high-concentration impurity regions 6b, and is made of a cobalt or titanium alloy, for example, to serve as the second metal silicide film.

The silicon nitride film 7 as the hydrogen supply film is formed so as to cover a part of an upper portion of the alloy film 6c. The silicon nitride film 7 covers not the entire resistive element 120 but only a part of the upper portion of the alloy film 6c, and even in a case in which a residual stress of the silicon nitride film 7 is significantly different from that of an adjacent film, occurrence of defect caused by such a residual stress can be suppressed by the smallness of volume and area. Further, even in a case in which the silicon nitride film 7 is formed by plasma and thus is likely to contain hydrogen, since the silicon nitride film 7 only covers a part of the upper portion of the alloy film 6*c* with small volume, an amount of hydrogen released with time from the silicon nitride film 7 can be reduced, and occurrence of defect caused by hydrogen can be suppressed.

Further, the silicon nitride film 7 is formed at a position apart from the low-concentration impurity region 6*a*. With this structure, the low-concentration impurity region 6*a* is less affected by hydrogen released from the silicon nitride film 7.

As a result, a change with time of the resistance can be reduced.

A distance between the low-concentration impurity region 6*a* and the silicon nitride film 7 is not particularly limited, and can be appropriately selected depending on the purpose. However, a distance of 1 μm or more and 3 μm or less is preferred.

In the first embodiment, the hydrogen supply film is assumed to be the silicon nitride film 7, but the present invention is not limited thereto. The hydrogen supply film may be formed of any other material as long as the material is likely to contain hydrogen and has a lower etching rate than a material for the interlayer insulating film. For example, a metal oxide, a metal nitride, or a carbon compound may be adopted.

The silicide block film 8 is formed so as to prevent the entire upper surface of the low-concentration impurity region 6*a* as the resistor from being covered with the low-resistance alloy film 6*c* and consequently impairing a function of the resistor.

Further, the silicide block film 8 as the hydrogen barrier film is formed over the entire upper surface of the low-concentration impurity region 6*a* and a part of an upper surface of each high-concentration impurity region 6*b* so that the low-concentration impurity region 6*a* is less affected by hydrogen released from the silicon nitride film 7 with time or through hydrogen annealing at the time of manufacture.

Further, the silicide block film 8 is formed of tetraethoxysilane (TEOS) to avoid contact with the silicon nitride film 7. With this structure, the silicide block film 8 keeps the low-concentration impurity region 6*a* as the resistor from being affected by the residual stress of the silicon nitride film 7. As a result, a change of the resistance can be suppressed.

On an upper surface of the resistive element 120, the BPSG film 9 is formed similarly to the upper surface of the MOSFET 110. The BPSG film 9 is formed therein the second contact holes 11 that pass therethrough up to the silicon nitride film 7. The metal wiring 12 is embedded in each second contact hole 11 to form conduction paths of the resistive element 120.

Each second contact hole 11 is formed so that its lower surface is located in the alloy film 6*c*. With this structure, the lower surface of the metal wiring 12 embedded in each second contact hole 11 reaches the low-resistance alloy film 6*c* within the alloy film 6*c*. As a result, a resistance at a joined portion between the metal wiring 12 and the second electrode portion of the resistive element 120 can be reduced.

In the first embodiment, the material for the metal wiring 12 is assumed to be tungsten, but the present invention is not limited thereto, and the material can be appropriately selected depending on the purpose.

At the top surface of the semiconductor device 100, the passivation film 13 is formed as a protective film.

The shape, structure, dimension, and material of the passivation film 13 are not particularly limited, and can be appropriately selected depending on the purpose.

In the semiconductor device 100 of the first embodiment, a metal film that is less permeable to hydrogen or moisture may be additionally formed in the vicinity of an upper portion of the resistive element 120. The semiconductor device 100 having such a metal film can suppress occurrence of defect caused by hydrogen or moisture.

The shape, structure, dimension, and material of the metal film are not particularly limited, and can be appropriately selected depending on the purpose.

(Manufacturing Method for Semiconductor Device)

Next, a method of manufacturing the semiconductor device 100 of the first embodiment is described with reference to FIG. 2A to FIG. 2G. FIG. 2A to FIG. 2G are explanatory schematic views for illustrating a flow of a series of steps in a process of manufacturing the semiconductor device of the first embodiment.

The method of manufacturing the semiconductor device of the present invention includes: a first semiconductor element formation step; a second semiconductor element formation step; a first contact hole formation step; a second contact hole formation step; and a metal wiring embedding step.

Figure 2A:
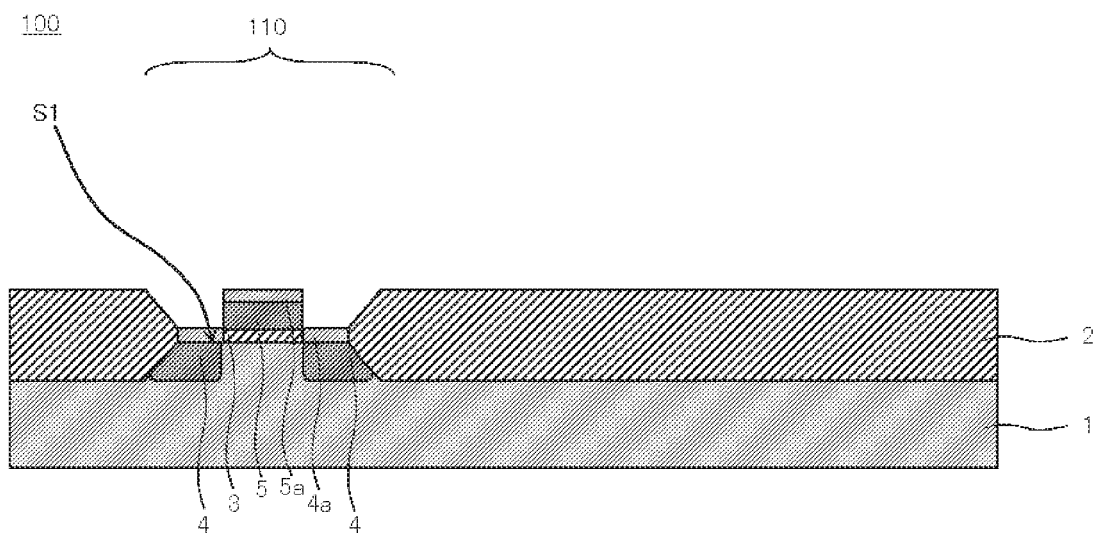
FIG. 2A is a schematic sectional view for explaining a series of process flows of manufacturing the semiconductor device according to the first embodiment of the present invention.

As illustrated in FIG. 2A, first of all, the substrate 1 is prepared and subjected to LOCOS formation processing, to form the isolation oxide film 2 on the substrate 1.

Next, in the first semiconductor element formation step, the gate oxide film 3, the source/drain regions 4, and the gate electrode 5 are formed at the first surface S1 through gate oxide film formation processing, source/drain region formation processing, gate electrode formation processing with polycrystalline silicon, and other such processing of a related-art MOSFET manufacturing technology. After that, the alloy films 4*a* and 5*a* made of a cobalt or titanium alloy, for example, are formed as the first metal silicide film on the source/drain regions 4 and the gate electrode 5, respectively.

As described above, in the first semiconductor element formation step, at the first surface S1 on the substrate 1, the MOSFET 110 having the first electrode portion that is formed thereon the alloy films 4*a* and 5*a*, is formed.

Figure 2B:
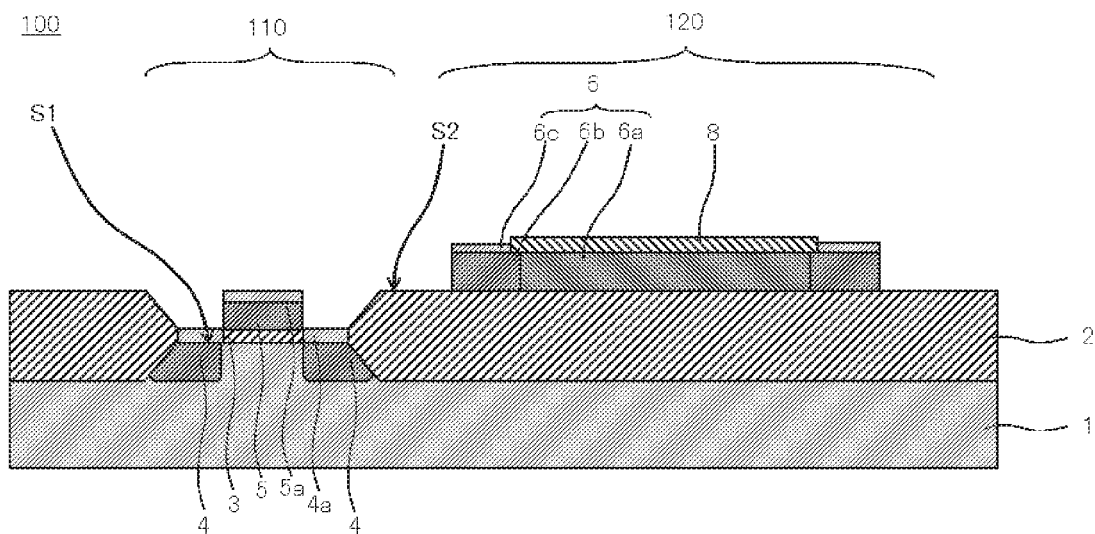
FIG. 2B is a schematic sectional view for explaining the series of process flows of manufacturing the semiconductor device according to the first embodiment of the present invention.

In the second semiconductor element formation step, as illustrated in FIG. 2B, the polycrystalline silicon film 6 for forming the resistive element 120 is also formed at the second surface S2. In order to obtain a desired resistivity of the resistive element 120, impurities are implanted to the entire upper surface of the polycrystalline silicon film 6 in an adjusted implantation amount, to thereby form the low-concentration impurity region 6*a*. Further, another photomask processing is performed to implant impurities into the polycrystalline silicon film 6, to thereby form the high-concentration impurity regions 6*b*.

Next, the silicide block film 8 is formed of tetraethoxysilane (TEOS) over the entire upper surface of the low-concentration impurity region 6*a* and a part of the upper surface of each high-concentration impurity region 6*b*. After that, the alloy film 6*c* made of a cobalt or titanium alloy, for example, is formed as the second metal silicide film on a portion not covered with the silicide block film 8, of each high-concentration impurity region 6*b*.

Figure 2C:
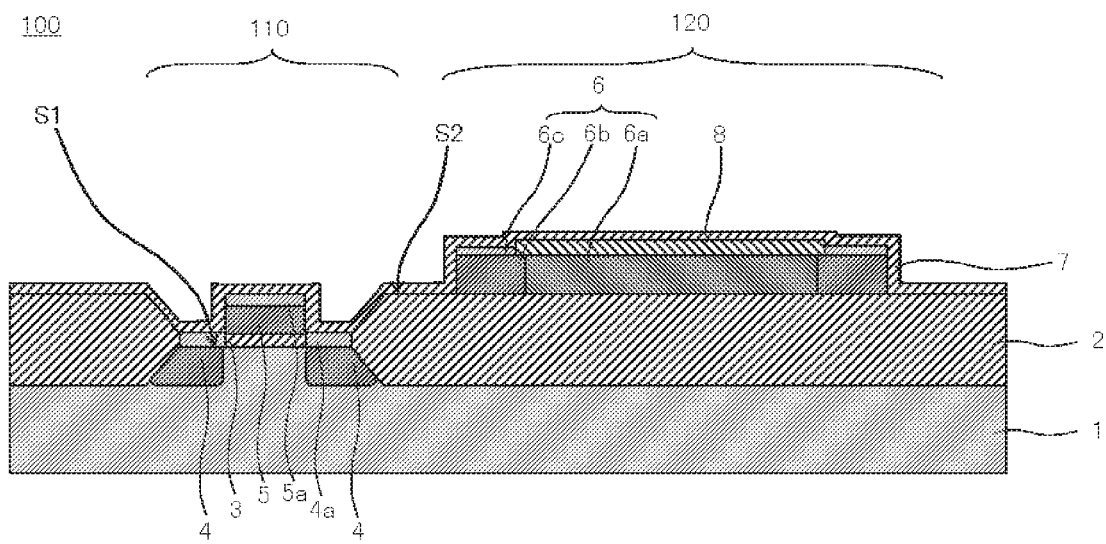
FIG. 2C is a schematic sectional view for explaining the series of process flows of manufacturing the semiconductor device according to the first embodiment of the present invention.

Next, as illustrated in FIG. 2C, the silicon nitride film 7 is formed over the entire surface through use of plasma. In the first embodiment, in a case of forming the silicon nitride film 7 by the low-pressure CVD, there is a fear in that the alloy film is melted. To avoid this, the silicon nitride film 7 is formed by plasma CVD.

A method of forming the silicon nitride film 7 is not particularly limited, and can be appropriately selected depending on the purpose. However, a formation method that adopts plasma is preferred in that a film formation temperature can be set low.

Figure 2D:
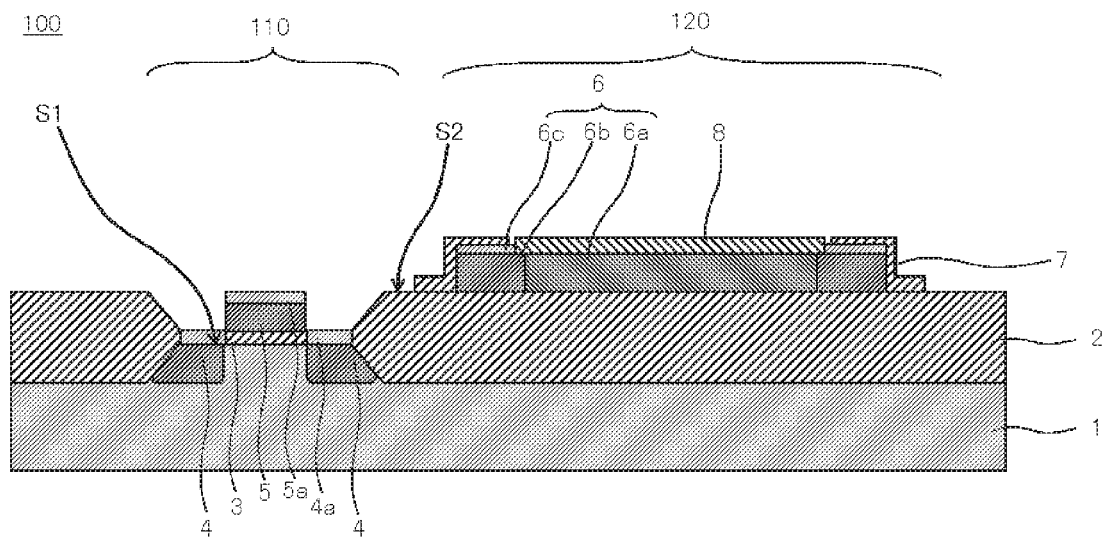
FIG. 2D is a schematic sectional view for explaining the series of process flows of manufacturing the semiconductor device according to the first embodiment of the present invention.

Next, as illustrated in FIG. 2D, through the photomask processing and the etching treatment, the silicon nitride film 7 is processed to cover a part of the upper portion of the alloy film 6c so as not to reach the silicide block film 8, and also the polycrystalline silicon film 6 and the silicon nitride film 7 are processed into the shape of the resistive element 120.

The etching treatment for the silicon nitride film 7 is not particularly limited, and can be appropriately selected depending on the purpose. For example, wet etching and anisotropic or isotropic dry etching can be adopted.

As described above, in the second semiconductor element formation step, at the second surface S2 at the higher position than the first surface S1, the resistive element 120 is formed. The resistive element 120 has the second electrode portion having formed thereon the alloy film 6c and the silicon nitride film 7 configured to cover a part of the upper portion of the alloy film 6c.

Figure 2E:
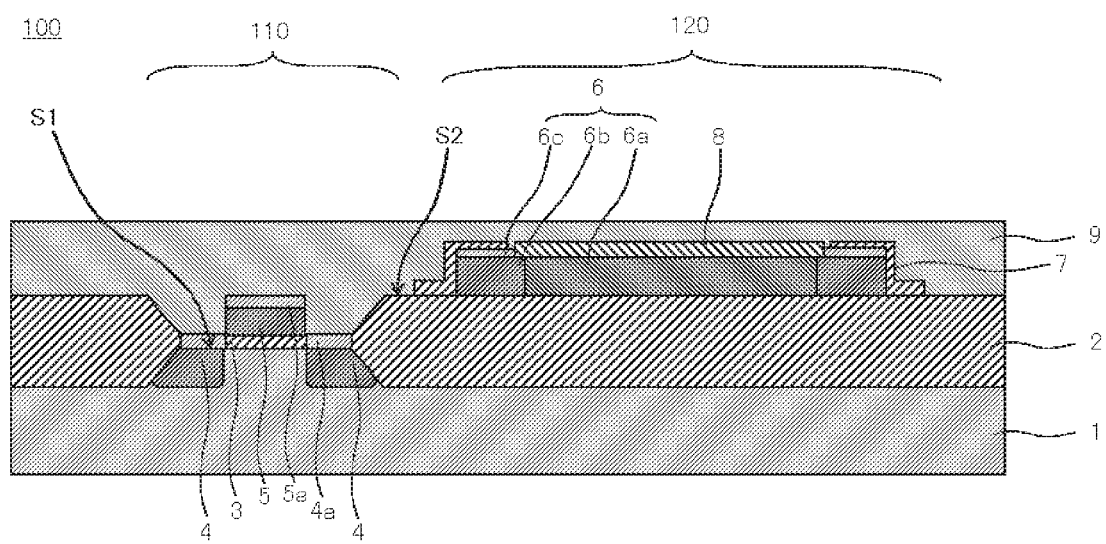
FIG. 2E is a schematic sectional view for explaining the series of process flows of manufacturing the semiconductor device according to the first embodiment of the present invention.

Next, in the interlayer insulating film formation step, as illustrated in FIG. 2E, the BPSG film 9 as the interlayer insulating film is formed.

A method of forming the BPSG film 9 is not particularly limited, and can be appropriately selected depending on the purpose. Further, a method of planarizing the BPSG film 9 is not particularly limited, and can be appropriately selected depending on the purpose. For example, a reflow method, an etch-back method, and a chemical mechanical polishing (CMP) method can be adopted. To describe the reflow method in detail, after an oxide film containing phosphorous or boron is formed, the oxide film may be planarized through heat treatment at 850° C. or higher.

As described above, in the interlayer insulating film formation step, the BPSG film 9 is formed on the MOSFET 110 and the resistive element 120.

Figure 2F:
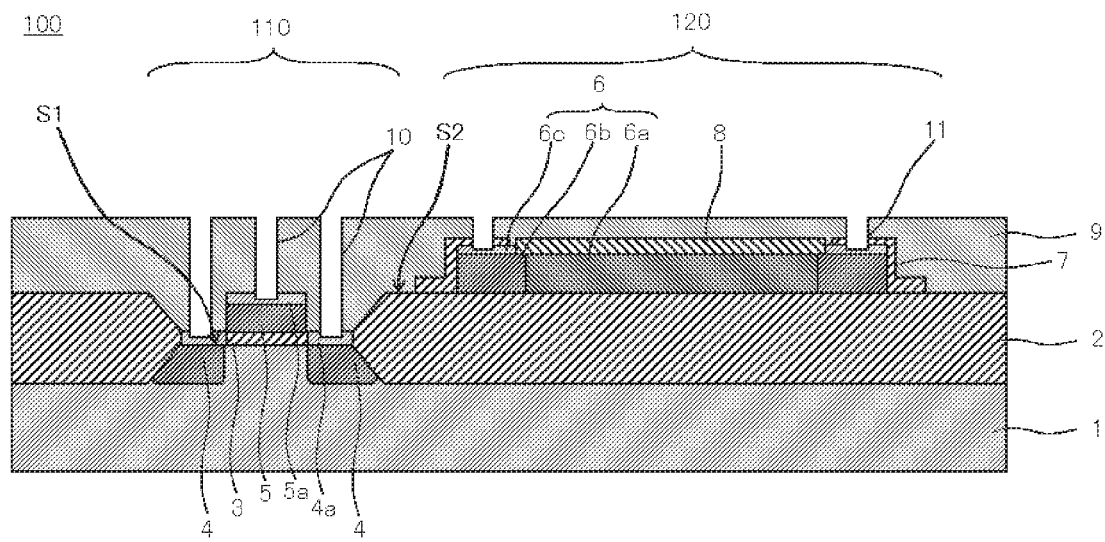
FIG. 2F is a schematic sectional view for explaining the series of process flows of manufacturing the semiconductor device according to the first embodiment of the present invention.

Next, in the first and second contact hole formation steps, as illustrated in FIG. 2F, the photomask processing is performed on portions required for the source/drain regions 4, the gate electrode 5, and the second electrode portion of the resistive element 120, and the first contact holes 10 and the second contact holes 11 are formed at a time through dry etching. At this time, the first surface S1 at which the MOSFET 110 is formed, and the second surface S2 at which the resistive element 120 is formed, are different in height from the bottom surface of the substrate 1 defined as a reference height. In this example, the second contact holes 11 have smaller depths than the first contact holes 10. In such a case, in the semiconductor device 100 of the first embodiment, even in a case of forming the contact holes having different depths at a time through the same etching treatment, the silicon nitride film 7 present on the second electrode portion functions as the etching stopper. As a result, the second contact holes 11 can be formed with no fear that the resistive element 120 is over-etched and perforated.

As described above, in the first contact hole formation step, the first contact holes 10 are formed so as to pass through the BPSG film 9 on the first electrode portion and reach the alloy films 4a and 5a. Further, in the second contact hole formation step, the second contact holes 11 are formed so as to pass through the BPSG film 9 and the silicon nitride film 7 on the second electrode portion and reach the alloy film 6c.

Figure 2G:
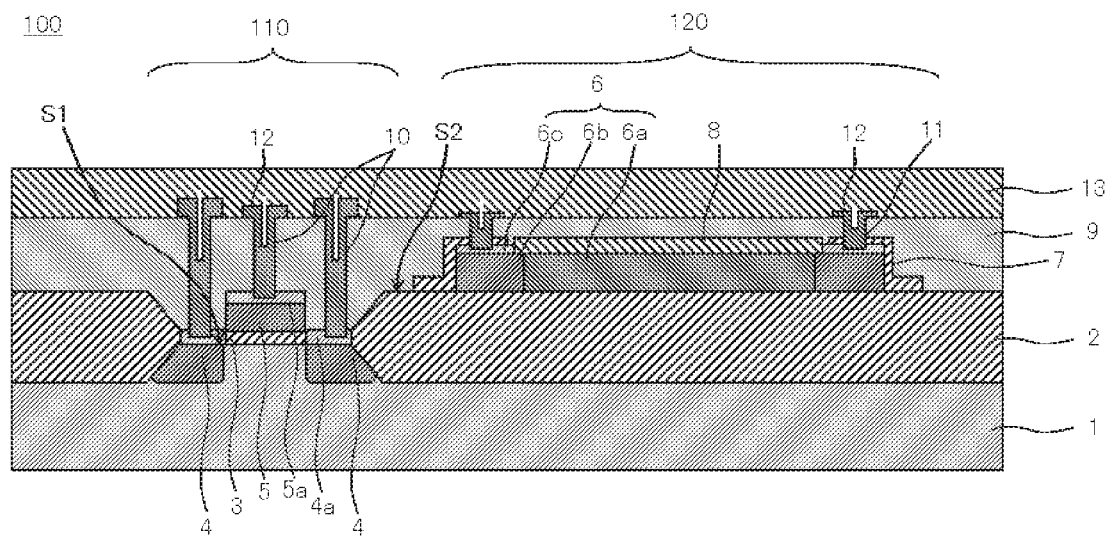
FIG. 2G is a schematic sectional view for explaining the series of process flows of manufacturing the semiconductor device according to the first embodiment of the present invention.

Next, in the metal wiring embedding step, as illustrated in FIG. 2G, tungsten that forms the metal wiring 12 is embedded into each of the first contact holes 10 and the second contact holes 11, to thereby form the conduction paths of the MOSFET 110 and the resistive element 120, respectively.

As described above, in the metal wiring embedding step, the metal wiring 12 is embedded into each of the first contact holes 10 and the second contact holes 11.

Finally, the passivation film 13 as the protective film is formed over the entire upper surface.

In this way, the semiconductor device 100 of the first embodiment can be manufactured.

At the time of forming the gate electrode 5 from the polycrystalline silicon film, the polycrystalline silicon film 6 for forming the resistive element 120 may be also formed at the second surface S2.

Further, at the time of forming the alloy films 4a and 5a made of a cobalt or titanium alloy, for example, as the first metal silicide film on the source/drain regions 4 and the gate electrode 5, respectively, the alloy film 6c made of a cobalt or titanium alloy, for example, may be formed as the second metal silicide film on the portion not covered with the silicide block film 8, of each high-concentration impurity region 6b.

At this time, phosphorous or arsenic, for example, is used in a case of forming an N-type impurity region, and boron or $BF_2$, for example, is used in a case of forming a P-type impurity region. An impurity implantation amount varies depending on a desired resistivity, but is set to, for example, from $1\times10^{15}$ atoms/cm$^3$ to $1\times10^{22}$ atoms/cm$^3$. This impurity implantation processing may also serve as the impurity implantation processing for forming the source/drain regions 4 of the MOSFET 110. Specifically, in a case of implanting N-type impurities into the resistive element 120, impurities used for forming N-type source/drain regions may be used and implanted through the same processing. Further, in a case of implanting P-type impurities into the resistive element 120, impurities used for forming P-type source/drain regions may be used and implanted through the same processing.

Second Embodiment

Figure 3:
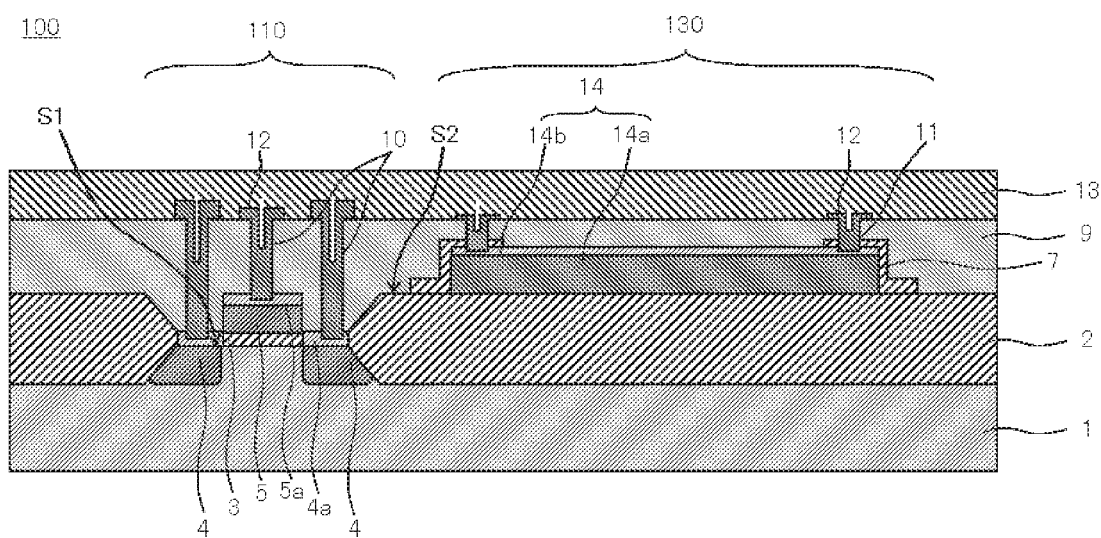
FIG. 3 is a schematic sectional view of a semiconductor device according to a second embodiment of the present invention.

FIG. 3 is a schematic sectional view of a semiconductor device according to a second embodiment of the present invention.

As illustrated in FIG. 3, the semiconductor device 100 of the second embodiment is the same as the semiconductor device 100 of the first embodiment except that the resistive element 120 as the second semiconductor element in the first embodiment is replaced by a fuse 130, and a film at an upper surface of the fuse 130 is open.

The fuse 130 has a high-concentration impurity region 14a and an alloy film 14b that is made of a cobalt or titanium alloy, for example, and configured to cover the entire upper surface of the high-concentration impurity region 14a. Further, the silicon nitride film 7 that functions as the etching stopper is formed on a part of an upper surface of the alloy film 14b that is made of a cobalt or titanium alloy, for example. In other words, the fuse 130 is formed at the second surface S2 at a higher position than the first surface S1, and has the second electrode portion having formed thereon the alloy film 14b and the silicon nitride film 7 that covers a part of the upper portion of the alloy film 14b.

Unlike the resistive element 120, the fuse 130 has such a structure that the second electrode portion is formed throughout the element.

The fuse 130 functions as follows: the fuse 130 is applied with energy through an opening portion as necessary, and the high-concentration impurity region 14a and the alloy film 14b are fused.

Because it has been found that in a case in which the alloy film 14b and the silicon nitride film 7 reach each other over a predetermined area or more, some gap develops therebetween due to a difference in thermal stress, and moisture infiltrates through the gap, the silicon nitride film 7 is formed on only a part of the upper surface of the alloy film 14b in the fuse 130 as in the resistive element 120.

The first and second semiconductor elements are respectively assumed to be the MOSFET 110 and the resistive element 120 in the first embodiment, and assumed to be the MOSFET 110 and the fuse 130 in the second embodiment, but the present invention is not limited thereto. For example, any combination of a MOSFET, a capacitor, a resistive element, and a fuse can be adopted as the first and second semiconductor elements.

As described above, the semiconductor device according to the at least one embodiment of the present invention includes: the first semiconductor element which is formed at the first surface on the substrate, and has the first electrode portion is formed thereon the first metal silicide film; the second semiconductor element which is formed at the second surface at the higher position than the first surface, and has the second electrode portion is formed thereon the second metal silicide film and the hydrogen supply film configured to cover a part of the upper portion of the second metal silicide film; the interlayer insulating film formed on the first semiconductor element and the second semiconductor element; the first contact hole formed so as to pass through the interlayer insulating film on the first electrode portion so as to reach the first metal silicide film; the second contact hole formed so as to pass through the interlayer insulating film and the hydrogen supply film on the second electrode portion so as to reach the second metal silicide film; and the metal wiring embedded in each of the first contact hole and the second contact hole.

With this structure, the semiconductor device according to the at least one embodiment of the present invention can reduce the resistance of the conduction path formed the contact hole and also can suppress occurrence of defect caused by hydrogen with time.

What is claimed is:

1. A semiconductor device, comprising:
    a first semiconductor element which is formed at a first surface on a substrate, and has a first electrode portion having formed thereon a first metal silicide film;
    a second semiconductor element which is formed at a second surface at a higher position than the first surface, and has a second electrode portion having formed thereon a second metal silicide film and a hydrogen supply film configured to cover at least a part of an upper portion of the second metal silicide film, wherein the hydrogen supply film does not cover a center portion of the second semiconductor element;
    an interlayer insulating film formed on the first semiconductor element and the second semiconductor element;
    a first contact hole formed so as to pass through the interlayer insulating film on the first electrode portion so as to reach the first metal silicide film;
    a second contact hole formed so as to pass through the interlayer insulating film and the hydrogen supply film on the second electrode portion so as to reach the second metal silicide film; and
    a metal wiring embedded in each of the first contact hole and the second contact hole.

2. The semiconductor device according to claim 1, further comprising a metal film formed in the vicinity of an upper portion of the second semiconductor element.

3. The semiconductor device according to claim 1,
    wherein the second semiconductor element is a resistive element formed from a polycrystalline silicon film having a low-concentration impurity region and high-concentration impurity regions, and
    wherein the hydrogen supply film is formed at a position apart from the low-concentration impurity region.

4. The semiconductor device according to claim 3, further comprising a hydrogen barrier film formed on the low-concentration impurity region.

5. A method of manufacturing a semiconductor device, comprising:
    forming a first semiconductor element at a first surface on a substrate, the first semiconductor element having a first electrode portion that is formed thereon a first metal silicide film;
    forming a second semiconductor element at a second surface at a higher position than the first surface, the second semiconductor element having a second electrode portion that is formed thereon a second metal silicide film and a hydrogen supply film configured to cover a part of an upper portion of the second metal silicide film, wherein the hydrogen supply film does not cover a center portion of the second semiconductor element;
    forming an interlayer insulating film on the first semiconductor element and the second semiconductor element;
    forming a first contact hole so as to pass through the interlayer insulating film on the first electrode portion so as to reach the first metal silicide film;
    forming a second contact hole so as to pass through the interlayer insulating film and the hydrogen supply film on the second electrode portion so as to reach the second metal silicide film; and
    embedding a metal wiring into each of the first contact hole and the second contact hole.

* * * * *